(12) United States Patent
Xia et al.

(10) Patent No.: US 8,669,891 B2
(45) Date of Patent: Mar. 11, 2014

(54) SYSTEMS AND METHODS FOR ADC BASED TIMING AND GAIN CONTROL

(75) Inventors: Haitao Xia, San Jose, CA (US); George Mathew, San Jose, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 83 days.

(21) Appl. No.: 13/186,267

(22) Filed: Jul. 19, 2011

(65) Prior Publication Data

US 2013/0021187 A1   Jan. 24, 2013

(51) Int. Cl.
  *H03M 3/00* (2006.01)

(52) U.S. Cl.
  USPC ........... 341/139; 341/118; 341/120; 341/142; 341/155

(58) Field of Classification Search
  USPC .................. 341/118, 120, 139, 142, 155
  See application file for complete search history.

(56) References Cited

U.S. PATENT DOCUMENTS

| | | | |
|---|---|---|---|
| 3,973,182 A | 9/1974 | Kataoka | |
| 3,973,183 A | 9/1974 | Kataoka | |
| 4,024,571 A | 8/1975 | Dischert et al. | |
| 4,777,544 A | 10/1988 | Brown et al. | |
| 5,130,866 A | 7/1992 | Klaassen et al. | |
| 5,237,325 A | 8/1993 | Klein et al. | |
| 5,278,703 A | 1/1994 | Rub et al. | |
| 5,309,357 A | 5/1994 | Stark et al. | |
| 5,341,249 A | 8/1994 | Abbott et al. | |
| 5,377,058 A | 12/1994 | Good et al. | |
| 5,521,948 A | 5/1996 | Takeuchi | |
| 5,523,902 A | 6/1996 | Pederson | |
| 5,594,341 A | 1/1997 | Majidi-Ahy | |
| 5,668,679 A | 9/1997 | Swearingen et al. | |
| 5,696,639 A | 12/1997 | Spurbeck et al. | |
| 5,781,129 A | 7/1998 | Schwartz et al. | |
| 5,787,125 A | 7/1998 | Mittel | |
| 5,798,885 A | 8/1998 | Saiki et al. | |
| 5,835,295 A | 11/1998 | Behrens | |
| 5,844,920 A | 12/1998 | Zook et al. | |
| 5,852,524 A | 12/1998 | Glover et al. | |
| 5,892,632 A | 4/1999 | Behrens | |
| 5,955,783 A | 9/1999 | Ben-Efraim | |
| 5,970,104 A | 10/1999 | Zhong et al. | |
| 5,986,830 A | 11/1999 | Hein | |
| 5,987,562 A | 11/1999 | Glover | |

(Continued)

FOREIGN PATENT DOCUMENTS

| | | |
|---|---|---|
| FR | 2904168 A1 | 1/2008 |
| WO | WO 03/047091 | 6/2003 |
| WO | WO 2008/009620 | 1/2008 |

OTHER PUBLICATIONS

U.S. Appl. No. 12/663,319, filed Dec. 7, 2009, Ratnakar Aravind.

(Continued)

*Primary Examiner* — Linh Nguyen
(74) *Attorney, Agent, or Firm* — Hamilton DeSanctis & Cha

(57) ABSTRACT

Various embodiments of the present invention provide circuits, systems and methods for data processing. For example, a data processing circuit is discussed that includes: an analog to digital converter circuit, a target response circuit, and a timing circuit. The analog to digital converter circuit is operable to receive a data input and to provide corresponding digital samples synchronous to a sampling phase. The sampling phase corresponds to a phase feedback. The target response circuit is operable to provide an expected output corresponding to a known input. The timing circuit is operable to generate the phase feedback based at least in part on values derived from the expected output.

28 Claims, 5 Drawing Sheets

(56) References Cited

U.S. PATENT DOCUMENTS

| | | | |
|---|---|---|---|
| 6,005,507 A * | 12/1999 | Nakatsu et al. ............... | 341/155 |
| 6,009,549 A | 12/1999 | Bliss et al. | |
| 6,023,383 A | 2/2000 | Glover et al. | |
| 6,067,198 A * | 5/2000 | Zuffada et al. ................. | 360/46 |
| 6,069,583 A | 5/2000 | Silvestrin et al. | |
| 6,081,397 A | 6/2000 | Belser | |
| 6,111,712 A | 8/2000 | Vishakhadatta et al. | |
| 6,118,606 A * | 9/2000 | Sasaki et al. .................... | 360/51 |
| 6,208,478 B1 | 3/2001 | Chiu et al. | |
| 6,269,058 B1 | 7/2001 | Yamanoi et al. | |
| 6,278,591 B1 | 8/2001 | Chang et al. | |
| 6,400,518 B1 | 6/2002 | Bhaumik et al. | |
| 6,404,829 B1 | 6/2002 | Sonu | |
| 6,411,452 B1 | 6/2002 | Cloke | |
| 6,441,661 B1 | 8/2002 | Aoki et al. | |
| 6,490,110 B2 | 12/2002 | Reed et al. | |
| 6,493,162 B1 | 12/2002 | Fredrickson | |
| 6,519,102 B1 | 2/2003 | Smith et al. | |
| 6,530,060 B1 | 3/2003 | Vis et al. | |
| 6,603,622 B1 | 8/2003 | Christiansen et al. | |
| 6,606,048 B1 | 8/2003 | Sutardja | |
| 6,633,447 B2 | 10/2003 | Franck et al. | |
| 6,646,822 B1 | 11/2003 | Tuttle et al. | |
| 6,657,802 B1 | 12/2003 | Ashley et al. | |
| 6,775,529 B1 | 8/2004 | Roo | |
| 6,788,484 B2 * | 9/2004 | Honma ............................ | 360/51 |
| 6,813,108 B2 | 11/2004 | Annampedu et al. | |
| 6,816,328 B2 * | 11/2004 | Rae ................................ | 360/51 |
| 6,839,014 B2 | 1/2005 | Uda | |
| 6,856,183 B2 | 2/2005 | Annampedu | |
| 6,876,511 B2 | 4/2005 | Koyanagi | |
| 6,912,099 B2 | 6/2005 | Annampedu et al. | |
| 6,963,521 B2 | 11/2005 | Hayashi | |
| 6,999,257 B2 | 2/2006 | Takeo | |
| 6,999,264 B2 | 2/2006 | Ehrlich | |
| 7,002,761 B1 | 2/2006 | Sutardja et al. | |
| 7,002,767 B2 | 2/2006 | Annampedu et al. | |
| 7,038,875 B2 | 5/2006 | Lou et al. | |
| 7,054,088 B2 | 5/2006 | Yamazaki et al. | |
| 7,072,137 B2 | 7/2006 | Chiba | |
| 7,082,005 B2 | 7/2006 | Annampedu et al. | |
| 7,092,462 B2 | 8/2006 | Annampedu et al. | |
| 7,116,504 B1 | 10/2006 | Oberg | |
| 7,126,776 B1 | 10/2006 | Warren, Jr. et al. | |
| 7,136,250 B1 | 11/2006 | Wu et al. | |
| 7,154,689 B1 | 12/2006 | Shepherd et al. | |
| 7,167,328 B2 | 1/2007 | Annampedu et al. | |
| 7,180,693 B2 | 2/2007 | Annampedu et al. | |
| 7,187,739 B2 | 3/2007 | Ma | |
| 7,191,382 B2 | 3/2007 | James et al. | |
| 7,193,544 B1 | 3/2007 | Fitelson et al. | |
| 7,193,798 B2 | 3/2007 | Byrd et al. | |
| 7,199,961 B1 | 4/2007 | Wu et al. | |
| 7,203,013 B1 | 4/2007 | Han et al. | |
| 7,206,146 B2 | 4/2007 | Flynn et al. | |
| 7,230,789 B1 | 6/2007 | Brunnett et al. | |
| 7,248,425 B2 | 7/2007 | Byun et al. | |
| 7,253,984 B1 | 8/2007 | Patapoutian et al. | |
| 7,265,937 B1 | 9/2007 | Erden et al. | |
| 7,286,313 B2 | 10/2007 | Erden et al. | |
| 7,301,717 B1 | 11/2007 | Lee et al. | |
| 7,308,057 B1 | 12/2007 | Patapoutian | |
| 7,323,916 B1 | 1/2008 | Sidiropoulos et al. | |
| 7,362,536 B1 | 4/2008 | Liu et al. | |
| 7,375,918 B1 | 5/2008 | Shepherd et al. | |
| 7,411,531 B2 | 8/2008 | Aziz et al. | |
| 7,420,498 B2 | 9/2008 | Barrenscheen | |
| 7,423,827 B2 | 9/2008 | Neville et al. | |
| 7,446,690 B2 | 11/2008 | Kao | |
| 7,499,238 B2 | 3/2009 | Annampedu | |
| 7,525,460 B1 | 4/2009 | Liu et al. | |
| 7,529,320 B2 | 5/2009 | Byrne et al. | |
| 7,558,177 B2 | 7/2009 | Ogura et al. | |
| 7,595,948 B1 * | 9/2009 | Oberg ............................ | 360/25 |
| 7,602,568 B1 | 10/2009 | Katchmart | |
| 7,616,395 B2 | 11/2009 | Yamamoto | |
| 7,620,101 B1 | 11/2009 | Jenkins | |
| 7,630,155 B2 | 12/2009 | Maruyama et al. | |
| 7,791,830 B2 * | 9/2010 | Miyashita ....................... | 360/65 |
| 8,018,360 B2 * | 9/2011 | Nayak ............................ | 341/118 |
| 2002/0001151 A1 | 1/2002 | Lake | |
| 2002/0005795 A1 * | 1/2002 | Asano et al. ................... | 341/139 |
| 2002/0150179 A1 | 10/2002 | Leis et al. | |
| 2002/0176185 A1 | 11/2002 | Fayeulle et al. | |
| 2002/0181377 A1 | 12/2002 | Nagata et al. | |
| 2002/0196717 A1 * | 12/2002 | Masui et al. ................ | 369/44.29 |
| 2003/0090971 A1 | 5/2003 | Gushima et al. | |
| 2003/0095350 A1 | 5/2003 | Annampedu et al. | |
| 2004/0179460 A1 | 9/2004 | Furumiya et al. | |
| 2005/0046982 A1 | 3/2005 | Liu et al. | |
| 2005/0157415 A1 | 7/2005 | Chiang | |
| 2005/0243455 A1 | 11/2005 | Annampedu | |
| 2007/0064847 A1 | 3/2007 | Gaedke | |
| 2007/0071152 A1 | 3/2007 | Chen et al. | |
| 2007/0103805 A1 | 5/2007 | Hayashi et al. | |
| 2007/0104300 A1 | 5/2007 | Esumi et al. | |
| 2007/0183073 A1 | 8/2007 | Sutardja et al. | |
| 2007/0230015 A1 | 10/2007 | Yamashita | |
| 2007/0263311 A1 | 11/2007 | Smith | |
| 2007/0280059 A1 | 12/2007 | Cheng et al. | |
| 2008/0056403 A1 | 3/2008 | Wilson | |
| 2008/0080082 A1 | 4/2008 | Erden et al. | |
| 2008/0212715 A1 | 9/2008 | Chang | |
| 2008/0266693 A1 | 10/2008 | Bliss et al. | |
| 2009/0002862 A1 | 1/2009 | Park et al. | |
| 2009/0142620 A1 | 6/2009 | Yamamoto et al. | |
| 2009/0245448 A1 * | 10/2009 | Ran et al. ....................... | 375/373 |
| 2009/0274247 A1 | 11/2009 | Galbraith et al. | |
| 2011/0193731 A1 * | 8/2011 | Daniels et al. ................. | 341/118 |
| 2012/0068870 A1 * | 3/2012 | Liu et al. ........................ | 341/155 |
| 2012/0124454 A1 * | 5/2012 | Liu et al. ........................ | 714/799 |

OTHER PUBLICATIONS

U.S. Appl. No. 12/838,601, filed Aug. 19, 2010, Wilson, Ross.
U.S. Appl. No. 12/851,475, filed Aug. 5, 2010, Annampedu, Viswanath.
U.S. Appl. No. 12/887,327, filed Sep. 21, 2010, Llu et al.
U.S. Appl. No. 12/894,221, filed Sep. 30, 2010, Yang et al.
U.S. Appl. No. 12/946,048, filed Nov. 15, 2010, Yang et al.
U.S. Appl. No. 12/947,962, filed Nov. 17, 2010, Liu et al.
U.S. Appl. No. 12/946,033, filed Nov. 15, 2010, Yang et al.
U.S. Appl. No. 12/955,789, filed Nov. 29, 2010, Annampedu et al.
U.S. Appl. No. 12/955,821, filed Nov. 29, 2010, Annampedu et al.
U.S. Appl. No. 12/972,904, filed Dec. 20, 2010, Viswanath Annampedu.
U.S. Appl. No. 13/100,021, filed May 3, 2011, Xia, Haitao et al.
U.S. Appl. No. 13/113,210, filed May 23, 2011, Zhang, Xun et al.
U.S. Appl. No. 13/014,754, filed Jan. 27, 2011, Viswanath Annampedu.
U.S. Appl. No. 13/009,067, filed Jan. 19, 2011, Zhang, Xun et al.
U.S. Appl. No. 13/050,048, filed Mar. 17, 2011, Xia, Haitao et al.
U.S. Appl. No. 13/096,873, filed Apr. 28, 2011, Wilson, Ross S.
U.S. Appl. No. 13/173,088, filed Jun. 30, 2011, Grundvig, et al.
U.S. Appl. No. 13/186,267, filed Jul. 19, 2011, Xia, Haitao et al.
U.S. Appl. No. 13/242,983, filed Sep. 23, 2011, Grundvig, Jeffery P.
Annampedu, V. et al, "Adaptive Algorithms for Asynchronous Detection of Coded Servo Signals Based on Interpolation", IEEE Transactions on Magnetics, vol. 41, No. 10, Oct. 2005.
Aziz and Annampedu, "Asynchronous Maximum Likelihood (ML) Detection of Servo repeatable Run Out (RRO) Data" Magnetics Conf. IEEE InternationalMay 2006.
Aziz et al "Interpolation Based Maximum-Likelihood(ML) Detection of Asynchronous Servo Repeatable Run Out (RRO) Data", Digest, IEEE Intl Magnetics Conf. vol. 42, No. 10 Oct. 2006.
Kryder, M. et al "Heat Assisted Magnetic Recording" Proc. IEEE, vol. 96, No. 11, p. 1810, Nov. 2008.
Weller et al "Thermal Limits in Ultrahigh-density Magnetic Recording" IEEE Trans. Magn. vol. 35, No. 6, p. 4423, Nov. 1999.

* cited by examiner

SYSTEMS AND METHODS FOR ADC BASED TIMING AND GAIN CONTROL

BACKGROUND OF THE INVENTION

The present invention is related to systems and methods for data processing, and more particularly to systems and methods for loop processing.

Various data processing circuits have been developed that include one or more loops. For example, a data processing circuit may receive a data signal that repeats at a defined frequency. In some cases, such loops are adjusting multiple modifiable parameters together. This can result in loop oscillation and/or improper loop operation.

Hence, for at least the aforementioned reasons, there exists a need in the art for advanced systems and methods for data processing.

BRIEF SUMMARY OF THE INVENTION

The present invention is related to systems and methods for data processing, and more particularly to systems and methods for loop processing.

Various embodiments of the present invention provide data processing circuits that include: an analog to digital converter circuit, a target response circuit, and a timing circuit. The analog to digital converter circuit is operable to receive a data input and to provide corresponding digital samples synchronous to a sampling phase. The sampling phase corresponds to a phase feedback. The target response circuit is operable to provide an expected output corresponding to a known input. The timing circuit is operable to generate the phase feedback based at least in part on values derived from the expected output. In some cases, the circuit is implemented as part of a storage device. In other instance, the circuit is implemented as part of a receiving device. Based upon the disclosure provided herein, one of ordinary skill in the art will recognize a variety of other devices into which circuits in accordance with embodiments of the present invention may be deployed. In various cases, the circuit is designed as part of a larger integrated circuit. In some cases, the known input is derived by applying a data processing algorithm to the digital samples. Such data processing algorithms may include, but are not limited to, a data detection algorithm and/or a data decoding algorithm. In one particular case, the data processing algorithms include a combination of a Viterbi algorithm data decoding process and a low density parity check decoding process. Based upon the disclosure provided herein, one of ordinary skill in the art will recognize a variety of data processing algorithms that may be utilized in accordance with different embodiments of the present invention.

In some instances of the aforementioned embodiments, the timing circuit is operable to adaptively calculate the phase feedback based on the digital samples and the values derived from the expected output. In one particular case, adaptively calculating the phase feedback is done in accordance with the following equation:

phase feedback=
    phase feedback−$\mu_1(x[n-1] \cdot \hat{x}[n,\tau] - x[n] \cdot \hat{x}[n-1,\tau])$, where $x[n-1]$ corresponds to a preceding instance of the digital samples, $x[n]$ corresponds to a current instance of the digital samples, $\hat{x}[n,\tau]$ corresponds to a current instance of the values derived from the expected output, $\hat{x}[n-1,\tau]$ corresponds to a preceding instance of the values derived from the expected output, and $\mu_1$ corresponds to an update rate value. In some such cases, the update rate value may be any value between zero and one.

In other particular cases, the circuit further includes a summation circuit operable to subtract the values derived from the expected output from the digital samples to yield an error output. In such cases, adaptively calculating the phase feedback is done in accordance with the following equation:

phase feedback=phase feedback−
    $\mu_1 \cdot$(error output)$\cdot \text{sgn}(\hat{x}[n,\tau] - \hat{x}[n-1,\tau])$, where $\hat{x}[n,\tau]$ corresponds to a current instance of the values derived from the expected output, $\hat{x}[n-1,\tau]$ corresponds to a preceding instance of the values derived from the expected output, and $\mu_1$ corresponds to an update rate value. In some such cases, the update rate value may be any value between zero and one.

In one or more instances of the aforementioned embodiments, the circuit further includes a variable gain amplifier operable to amplify an analog input by a gain corresponding to a gain feedback to yield an amplified output. The data input is derived from the amplified output, and the timing circuit is further operable to generate a gain feedback based at least in part on values derived from the expected output. In some such instances, the circuit further includes a summation circuit operable to subtract the values derived from the expected output from the digital samples to yield an error output. In these cases, the timing circuit is operable to adaptively calculate the gain feedback based on the error output and the values derived from the expected output. In one particular case, adaptively calculating the gain feedback is done in accordance with the following equation:

gain feedback=
    gain feedback−$\mu_1 \cdot$(error output)$\cdot \text{sgn}(\hat{x}[n,\tau])$, where $\text{sgn}(\hat{x}[n,\tau])$ corresponds to a sign of a current instance of the values derived from the expected output, and $\mu_1$ corresponds to an update rate value.

In various instances of the aforementioned embodiments, the target response circuit is implemented as a look-up table having pre-computed values selectable using the known input. In some such instances, the target response circuit further includes an interpolator circuit that is operable to interpolate from one or more pre-computed values to generate a value corresponding to the known input. In one or more instances of the aforementioned embodiments, the target response circuit is implemented as an adaptable filter circuit receiving the known input.

Other embodiments of the present invention provide data processing circuits that include: a variable gain amplifier, an analog to digital converter circuit, a target response circuit, a summation circuit, and a gain circuit. The variable gain amplifier is operable to amplify an analog input by a gain corresponding to a gain feedback to yield an amplified output. The analog to digital converter circuit operable to receive a signal derived from the amplified output and to provide corresponding digital samples. The target response circuit is operable to provide an expected output corresponding to a known input. The summation circuit is operable to subtract values derived from the expected output from the digital samples to yield an error output. The gain circuit is operable to generate the gain feedback based at least in part on the error output and the values derived from the expected output.

Yet other embodiments of the present invention provide methods for updating a control loop. The methods include: receiving an analog input signal including information corresponding to a known input; amplifying a signal derived from the input signal by a gain to yield an amplified output; converting a signal derived from the amplified output to yield a series of digital samples synchronous to a sampling phase; applying a channel response model to the known input to yield an expected output; subtracting an output derived from the expected output from the digital samples to yield an error output; and calculating the gain feedback based at least in part on the error output and the output derived from the expected output. The sampling phase corresponds to a phase feedback, and the gain corresponds to a gain feedback. In some cases, the methods further include calculating the phase feedback based at least in part on the error output and the output derived from the expected output. In other cases, the methods further include calculating the phase feedback based at least in part on the digital samples and the output derived from the expected output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for data processing, and more particularly to systems and methods for loop processing.

Figure 1:
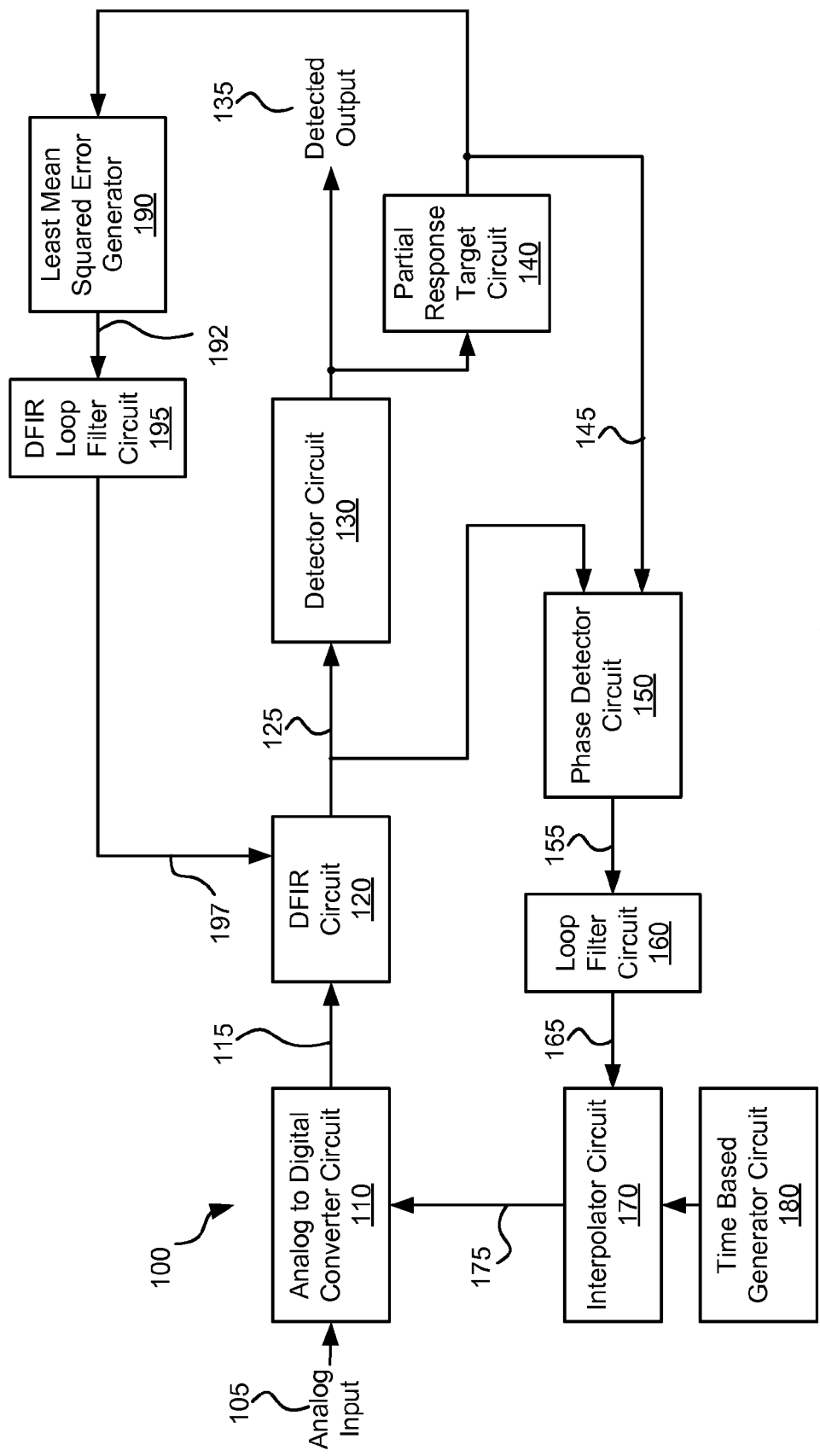
FIG. 1 depicts an existing timing recovery loop circuit.

Turning to FIG. 1, an existing timing recovery loop circuit 100 is depicted. Timing recovery loop circuit 100 includes an analog to digital converter circuit 110 that converts an analog input signal 105 into a series of digital samples 115 that are provided to a digital finite impulse response (DFIR) filter 120. DFIR filter 120 filters the received input and provides a corresponding filtered output 125 to both a detector circuit 130 and a phase detector circuit 150. Detector circuit 130 performs a data detection process on the received input resulting in a detected output 135. In performing the detection process, detector circuit 130 attempts to correct any errors in the received data input.

Detected output 135 is provided to a partial response target circuit 140 that creates a partial response output 145 compatible with filtered output 125. Detected output 135 is also provided to a least mean squared error generator circuit 190 that provides an error output 192 to a loop filter circuit 195. DFIR loop filter circuit 195 provides a filtered output 197 (i.e., filter taps) to DFIR circuit 120. The operation of DFIR circuit 120 is governed at least in part by filtered output 197.

Phase detector circuit 150 determines a phase difference between partial response output 145 and filtered output 125 and yields a phase error output 155. When timing recovery loop circuit 100 is properly synchronized to analog input 105, phase error output 155 goes to zero. Phase error output 155 is provided to a loop filter circuit 160 that filters the received input and provides a corresponding filtered output 165. Filtered output 165 is provided to an interpolator circuit 170 that is operable to determine an optimal sampling phase/frequency for a sampling clock 175. Sampling clock 175 is based on a clock input provided by a time based generator circuit 180. The next instance of analog input 105 is sampled by analog to digital converter circuit 110 synchronous to sampling clock 175.

As shown, timing recovery loop circuit 100 uses filtered output 125 to generate both filtered output 197 provided to DFIR circuit 120 and sampling clock 175. As filtered output 197 effects sampling clock 175 and sampling clock 175 effects filtered output 197, there is a possibility that the loops will be unstable. To limit the instability, filtered output 197 may be constrained. Further, the interaction can cause a change in the transfer function of DFIR circuit 120 resulting in sub-optimal operation of DFIR circuit 120.

Figure 2:
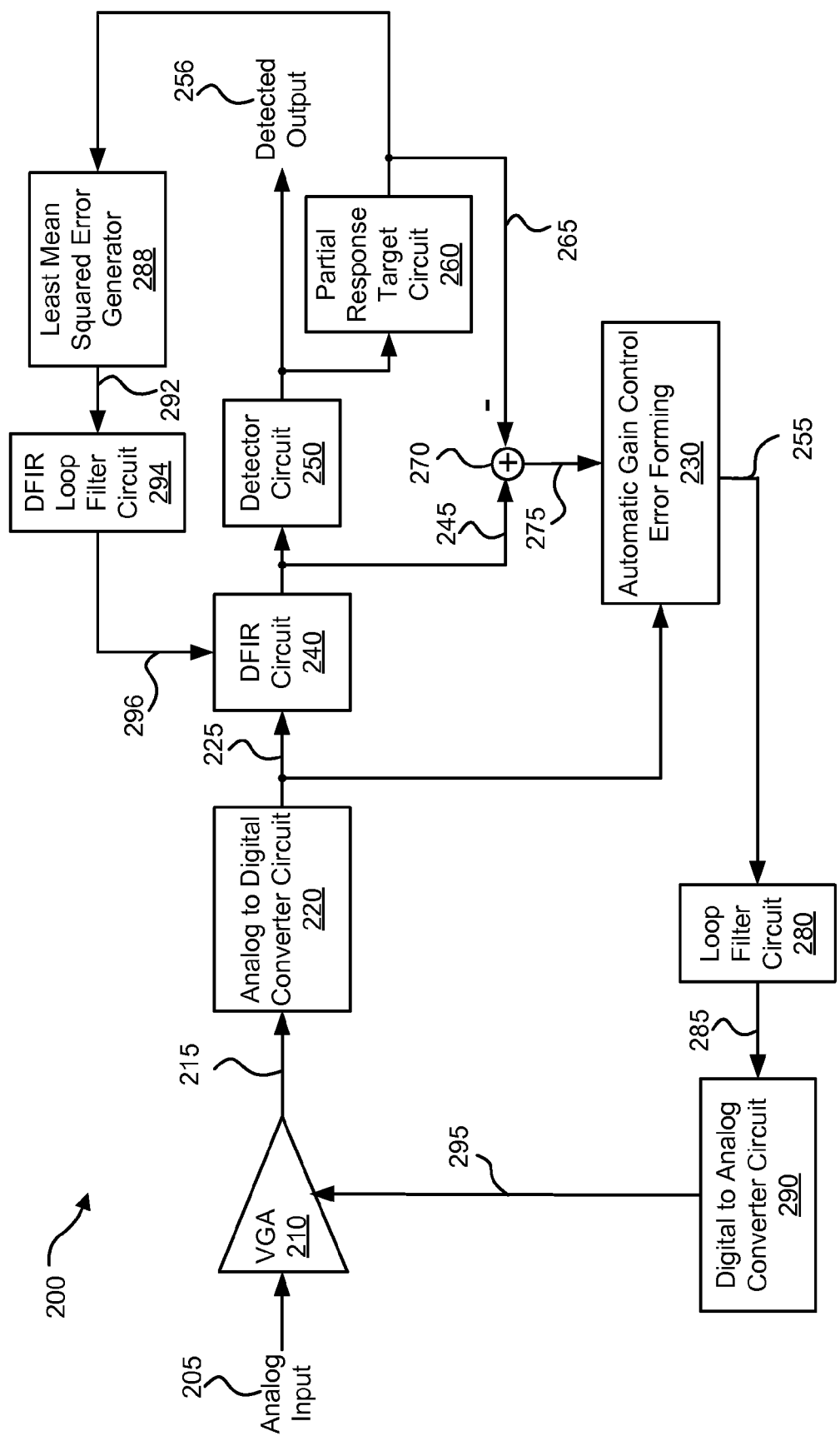
FIG. 2 depicts an existing automatic gain control loop circuit.

Turning to FIG. 2, depicts an existing automatic gain control loop circuit 200. Automatic gain control loop circuit 200 includes a variable gain amplifier 210 that receives an analog input 205. Variable gain amplifier 210 amplifies analog input 205 to yield an amplified output 215 that is provided to an analog to digital converter circuit 220. Analog to digital converter circuit 220 converts the received signal into a series of digital samples 225 that are provided to a DFIR circuit 240. DFIR circuit 240 filters the received input and provides a corresponding filtered output 245. In addition, digital samples 225 are provided to an automatic gain control error forming circuit 230.

Filtered output 245 is provided to both a detector circuit 250 and a summation circuit 270. Detector circuit 250 performs a data detection process on the received input resulting in a detected output 256. In performing the detection process, detector circuit 250 attempts to correct any errors in the received data input. Detected output 256 is provided to a partial response target circuit 260 that creates a partial response output 265 compatible with filtered output 245. Summation circuit 270 subtracts partial response output 265 from filtered output 245 to yield an error value 275. Error value 275 is provided to automatic gain control error forming circuit 230 where it is used to modify digital samples to yield an error feedback signal 255. Error feedback signal 255 is provided to a loop filter circuit 280 that filters the received input and provides a filtered output 285 to a digital to analog converter circuit 290. Digital to analog converter circuit 290 converts the received input to feedback signal 295. Feedback signal 295 governs the level of amplification applied by variable gain amplifier circuit 210. Detected output 256 is also provided to a least mean squared error generator circuit 288 that provides an error output 292 to a loop filter circuit 294.

DFIR loop filter circuit 294 provides a filtered output 296 (i.e., filter taps) to DFIR circuit 240. The operation of DFIR circuit 240 is governed at least in part by filtered output 296.

As shown, timing recovery loop circuit 200 uses filtered output 225 to generate both filtered output 296 provided to DFIR circuit 240 and feedback signal 295. As filtered output 296 effects feedback signal 295 and feedback signal 295 effects filtered output 296, there is a possibility that the loops will be unstable. To limit the instability, filtered output 296 may be constrained. Further, the interaction can cause a change in the transfer function of DFIR circuit 240 resulting in sub-optimal operation of DFIR circuit 240.

Various embodiments of the present invention provide data processing circuits that utilize ADC based timing and loop gain circuits. As used herein, the term "ADC based" is used in its broadest sense to mean any output derived from an analog to digital converter circuit. Such an approach greatly limits the interaction between the timing and gain loops and other downstream processing including, but not limited to, data equalization and data detection. As one of various advantages, limiting the interaction yields greater loop stability, reduces circuit complexity, and/or removes constraints on the downstream processing circuitry. Based upon the disclosure provided herein, one of ordinary skill in the art will recognize other advantages in addition to, or alternative to the aforementioned advantages that may be achieved using different embodiments of the present invention.

In some cases, a channel model producing an output corresponding to an output of an analog front end circuit and analog to digital converter circuit is developed. This channel model is included in a circuit as a target response circuit that receives a known input and provides an expected output that corresponds to an output of an analog to digital converter circuit. This expected output can be used to determine whether the phase and gain evident in digital samples output from an analog to digital converter circuit are correctly set. In some cases, the channel model is a software model that provides outputs that are stored to a look-up table that may be used during circuit operation. In such cases, the target response circuit is the look-up table. Alternatively, the target response circuit may be implemented as a digital finite impulse response filter with a phase parameter that corresponds to a required sampling phase of the analog to digital converter circuit. The main taps of the digital finite impulse response circuit are identified as an analog to digital converter target. The output of the model (i.e., the analog to digital converter target) is scaled according to a desired dynamic range of the analog to digital converter circuit, and an error is calculated at the difference between the scaled model output and an output of the analog to digital converter circuit. A loop circuit adjusts a gain feedback and a phase feedback to drive the error to a minimum.

Figure 3:
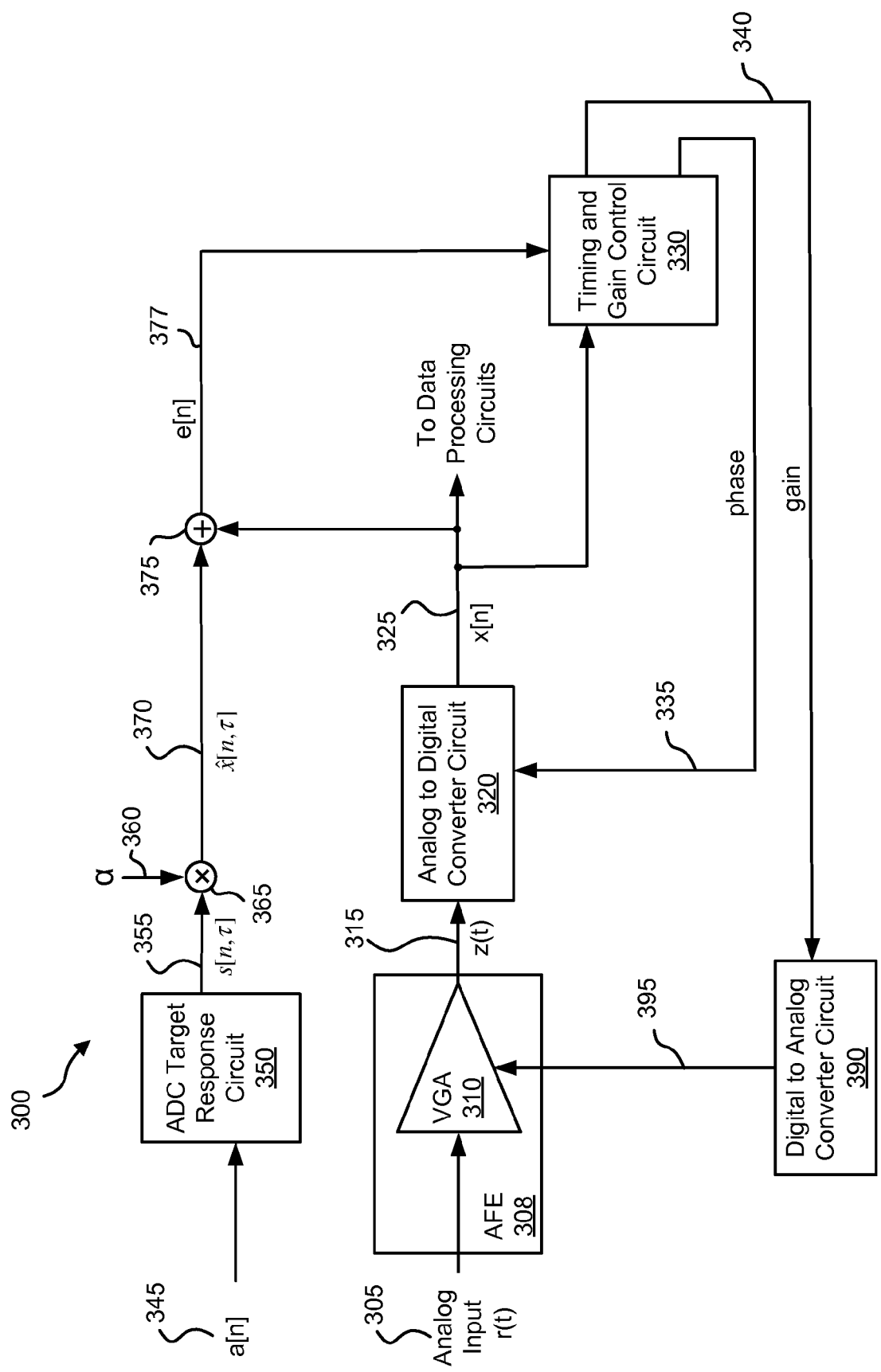
FIG. 3 depicts a combination automatic gain control loop and timing recovery loop circuit relying on an ADC output to determine gain and phase information in accordance with one or more embodiments of the present invention.

Turning to FIG. 3 a combination automatic gain control loop and timing recovery loop circuit 300 relying on an ADC output to determine gain and phase information is shown in accordance with one or more embodiments of the present invention. Circuit 300 includes an analog front end circuit 308 that includes a variable gain amplifier 310. Based upon the disclosure provided herein, one of ordinary skill in the art will recognize additional analog processing circuitry in addition to variable gain amplifier 310 that maybe included as part of analog front end circuit 308. Analog front end circuit 308 receives an analog input (r(t)) 305, and a signal derived from analog input 305 is amplified by variable gain amplifier 310. Variable gain amplifier 310 may be any circuit known in the art that is capable of amplifying a received signal by a gain that can be changed. The gain of variable gain amplifier 310 is controlled at least in part by a gain feedback 340. Based upon the disclosure provided herein, one of ordinary skill in the art will recognize a variety of circuits that may be used to implement variable gain amplifier 310. Analog input 305 may be any analog signal carrying information to be processed. In some embodiments of the present invention, analog input 305 is derived from a storage medium. In other embodiments of the present invention, analog input 305 is derived from a transmission device. Based upon the disclosure provided herein, one of ordinary skill in the art will recognize a variety of analog signals and/or sources thereof that may be used in relation to different embodiments of the present invention. Variable gain amplifier 310 provides an amplified output (z(t)) 315 to an analog to digital converter circuit 320.

Analog to digital converter circuit 320 may be any circuit known in the art that is capable of converting an analog signal into a series of digital values representing the received analog signal. Analog to digital converter circuit 320 converts the received amplified output 315 into a series of digital samples (x[n]) 325 that are provided to one or more downstream data processing circuits. In some cases, the downstream data processing circuits include, but are not limited to, a data detector circuit and a data decoder circuit. Based upon the disclosure provided herein, one of ordinary skill in the art will recognize a variety of downstream data processing circuits that may be used in relation to different embodiments of the present invention. In addition, digital samples 325 are provided to a summation circuit 375 and to a timing and gain control circuit 330. The sampling phase of digital samples 325 is at least in part governed by a phase feedback 335.

An ADC target response circuit 350 receives a known input (a[n]) 345 used to train the channel (i.e., determine an appropriate gain and phase for circuit 300). ADC target response circuit 350 applies a predicted channel response to known input 345 to provide an expected output (s[n,τ]) 355 to a multiplier circuit 365. In some embodiments of the present invention, known input 345 is programmed into a memory from which it may be accessed and provided to ADC target response circuit 350. In other embodiments of the present invention, known input 345 is derived from a pattern stored to a storage medium. The pattern stored to the storage medium is sensed by a read/write head assembly (not shown), passed through analog front end circuit 308 and analog to digital converter circuit 320 to yield digital samples 325, and digital samples are processed by downstream data processing circuits where the original data is recovered. The recovered data is known input 345.

In some embodiments of the present invention, ADC target response circuit 350 is implemented as a look up table with pre-computed values modeling an expected output of the combination of analog front end circuit 308 and analog to digital converter circuit 320 based upon a given known input. Such an approach may involve modeling the output of analog to digital converter circuit 320 using information corresponding to a nominal channel bit density of a device or channel from which analog input 305 is derived. This includes computing a bit response ($h_b[n]$) of the channel for an assumed shape (e.g., erf( ) or tan h( ) for the step response of the channel ($h_s[n]$). In such a case, a look up table programmed with pre-computed values and addressed by a quantized channel bit density provides an efficient implementation.

Alternatively, ADC target response circuit 350 may be implemented as a digital finite impulse response circuit that receives the known input and applies a filter model governed by adaptively updated filter taps. Such an approach may use information on the nominal corner frequencies and boost of analog front end circuit 308. Using the nominal corner frequencies and boost of analog front end circuit 308, an impulse response of analog front end circuit can be constructed. The constructed impulse response of analog front end circuit 308 is convolved using a digital finite impulse response filter with a raw channel bit response ($h_s[n]$). In some cases, a first polynomial model for the channel bit response ($h_b[n]$) parameterized by a channel bit density, and a second polynomial model for analog front end impulse response parameterized by nominal corner frequencies and boost of analog front end circuit 308 can be developed to simplify implementation complexity.

Where either of the aforementioned approaches are used, the constructed channel model is used along with given values of sampling phase and dynamic range of analog to digital converter circuit 320 to determine a scalar value ($\alpha$) 360 and an analog to digital converter target response. In particular, the overall channel bit response for $\tau=[0,1]$ (i.e., $\tau$ extends from no phase offset to a full bit period offset) representing the sampling phase of analog to digital converter circuit 320 normalized to a bit period, and $[-\beta, +\beta]$ representing the dynamic range of analog to digital converter circuit:

$$h_b[k,\tau]=h_s[k,\tau]-h_s[k-1,\tau],$$

$$h_s[k, \tau] = \text{erf}\left(2\sqrt{\ln 2}\ \frac{k+\tau}{\text{channel bit density}}\right),$$

$$\tilde{h}_b[k, \tau] = \sum_l h_b[k - l, \tau] f[l],$$

where $h_b[k,\tau]$ is the channel bit response, $h_s[k,\tau]$ is the raw channel model, $\tilde{h}_b[k,\tau]$ the analog front end filtered raw channel bit response, and f[k] is the impulse response of analog front end circuit 308. Based upon the aforementioned equations, the analog to digital converter target is calculated in accordance with the following equation:

$$g[k,\tau]=\tilde{h}_b[k,\tau].$$

Using this analog to digital converter target, expected output ($s[n,\tau]$) 355 can be expressed as:

$$s[n, \tau] = \sum_{k=-M}^{M} a[k]g[k, \tau],$$

where a[k] are instances of known input 345. Scalar value 360 is calculated in accordance with the following equation:

$$\alpha = \frac{\beta}{\sum_{k=-M}^{M} g[k, \tau]}.$$

Of note, where the phase and gain of circuit 300 is adjusted appropriately, expected output 355 will be proportional to digital samples 325. Multiplier circuit 365 multiplies expected output 355 by scalar value ($\alpha$) 360 to yield a scaled output ($\hat{x}[n,\tau]$) 370 that when the phase and gain of circuit 300 are properly adjusted should be the same as digital samples 325. Scaled output 370 is provided to summation circuit 375 where it is subtracted from digital samples 325 to yield an error output (e[n]) 377 in accordance with the following equation:

$$e[n]=x[n]-\hat{x}[n,\tau],$$

where $\tau$ corresponds to a phase difference between the expected output 355 and the actual output (digital samples 325).

Error output 377 is provided along with digital samples 325 to timing and gain control circuit 330. Timing and gain control circuit 330 is operable to adjust phase feedback 335 over a range of values while maintaining gain feedback 340 constant. Phase feedback 335 is provided to analog to digital converter circuit 320 that modifies the sampling phase for the sampling of amplified output 315 to yield digital samples 325. It is determined which value of phase feedback 335 yields a minimum value of error output 377, and the sampling phase of analog to digital converter circuit 320 is set to correspond to the determined phase feedback 335. This sampling phase is used during real time processing of data received via analog input 305.

Once the phase is adjusted, timing and gain control circuit 330 adjust gain feedback 340 over a range of values while maintaining phase feedback 335 at the earlier determined value. Gain value 340 is converted to an analog feedback signal 395 by a digital to analog converter circuit 390, and the amplification applied by variable gain amplifier 310 is adjusted to correspond to analog feedback signal 395. It is determined which value of gain feedback 340 yields a minimum value of error output 377, and the gain of variable gain amplifier 310 is set to correspond to the determined gain feedback 340. The gain is used during real time processing of data received via analog input 305.

Alternatively, rather than sweeping through a range of phase and gain feedback values, timing and gain control circuit 330 may implement an adaptive feedback update to adaptively adjust phase feedback 335 and gain feedback 340. Such an adaptive approach may be operated in accordance with the following equations:

phase feedback 335=phase feedback 335−
$\mu_1 \cdot e[n] \cdot \text{sgn}(\hat{x}[n,\tau]-\hat{x}[n-1,\tau])$;

and gain feedback 340=gain feedback 340−
$\mu_1 \cdot e[n] \cdot \text{sgn}(\hat{x}[n,\tau])$.

In this case, $\mu_1$ is a programmable scaling factor that controls the amount of change to gain feedback 340 and phase feedback 335 that is allowed for any bit period. Alternatively, the adaptive approach may be operated in accordance with the following equations:

phase feedback 335=phase feedback 335−
$\mu_1(x[n-1] \cdot \hat{x}[n,\tau]-x[n] \cdot \hat{x}[n-1,\tau])$;

and gain feedback 340=gain feedback 340−
$\mu_1 \cdot e[n] \cdot \text{sgn}(\hat{x}[n,\tau])$.

Once the adaptive loop settles, a sampling phase corresponding to phase feedback 335 and a gain corresponding to gain feedback 340 are used during real time processing of data received via analog input 305. In some cases, $\mu_1$ may be modified depending upon the noise quality of known input 345. For example, if known input 345 exhibits a high signal to noise ratio (e.g., a 2T pattern), $\mu_1$ may be set to relatively high compared to a situation where known input 345 exhibits a low signal to noise ratio (e.g., a Nyquist pattern).

In some cases, the effective signal to noise ratio of the signal driving the feedback loops is enhanced by designing circuit 300 such that updates of phase feedback 335 and gain feedback 340 are only implemented or calculated when certain patterns appear in the stream of data bits. For example, loop updates may occur only when a 2T pattern (i.e., a '110011001100 . . . ' pattern) is detected in analog input 305. In some cases, a certain set of patterns resulting in an update may be programmed into a memory. By limiting updates to the occurrence of certain patterns, problematic patterns such as, for example, a Nyquist pattern which has a very low signal to noise ratio, are avoided.

In various cases, in place of the look-up table and polynomial fit based approaches discussed above, an adaptive approach may be employed to determine the analog to digital converter target for a specified sampling phase. In particular, the analog to digital target and scalar value may be initialized using the available channel model $\tilde{h}_{b,0}[k,\tau]$ in accordance with the following equations:

$$\text{initial analog to digital converter target} = g[k,\Sigma] = \tilde{h}_{b,0}[k,\tau], \text{ for } k=-M \text{ to } M; \text{ and}$$

$$\text{initial scalar value} = \alpha_0 = \frac{\beta}{\sum_{k=-M}^{M} g[k,\tau]}.$$

Using the aforementioned analog to digital converter target and scalar values, the channel bit response is adaptively updated for a given set of input data. Updating the channel bit response may be done in accordance with the following equations:

$$\hat{x}_l[n,\tau] = \alpha_l \sum_{k=-M}^{M} \alpha_l[k]g_l[n-k,\tau],$$

$$\hat{h}_b[k,0] = \tilde{h}_{b,l}[k,\tau],$$

and $$\hat{h}_b[k,n+1] = \hat{h}_b[k,n] + \mu \cdot e[n] \cdot a_l[n-k],$$

where $\hat{x}_l[n,\tau]$ is output of the model of the analog front end circuit, $\hat{h}_b[k,0]$ is the initial model at the $l^{th}$ sector ($l \geq 0$), $\hat{h}_b[k,n+1]$ is the updated channel model for the $l^{th}$ sector, $x_l[n]$ are data samples at the output of the analog to digital converter circuit for the $l^{th}$ sector, $\mu$ is a programmable updating gain, k is a tap index in the channel model, and n is a time index. In some cases, the channel bit response is not updated unless the received input data set can be properly processed by the downstream data processing circuits. For example, the channel bit response may not be updated if an expected sync mark within a sector of data is not found. Alternatively, an update to the channel bit response may not be implemented is a sector of data is not properly detected and decoded using a downstream data detector circuit and data decoder circuit as are known in the art.

At the end of the update period (e.g., end of a currently processing sector), interpolation may be used on the updated channel bit response to determine an updated analog to digital target and scalar value. This interpolation is used to compute the channel bit response for a particular sampling phase. The sampling phase to be used for interpolation can be determined by using the knowledge of an expected input pattern (e.g., a 2T input pattern), and an estimated channel response during times when the pattern is not available by fixing the sampling phase based on the 2T pattern.

Figure 4:
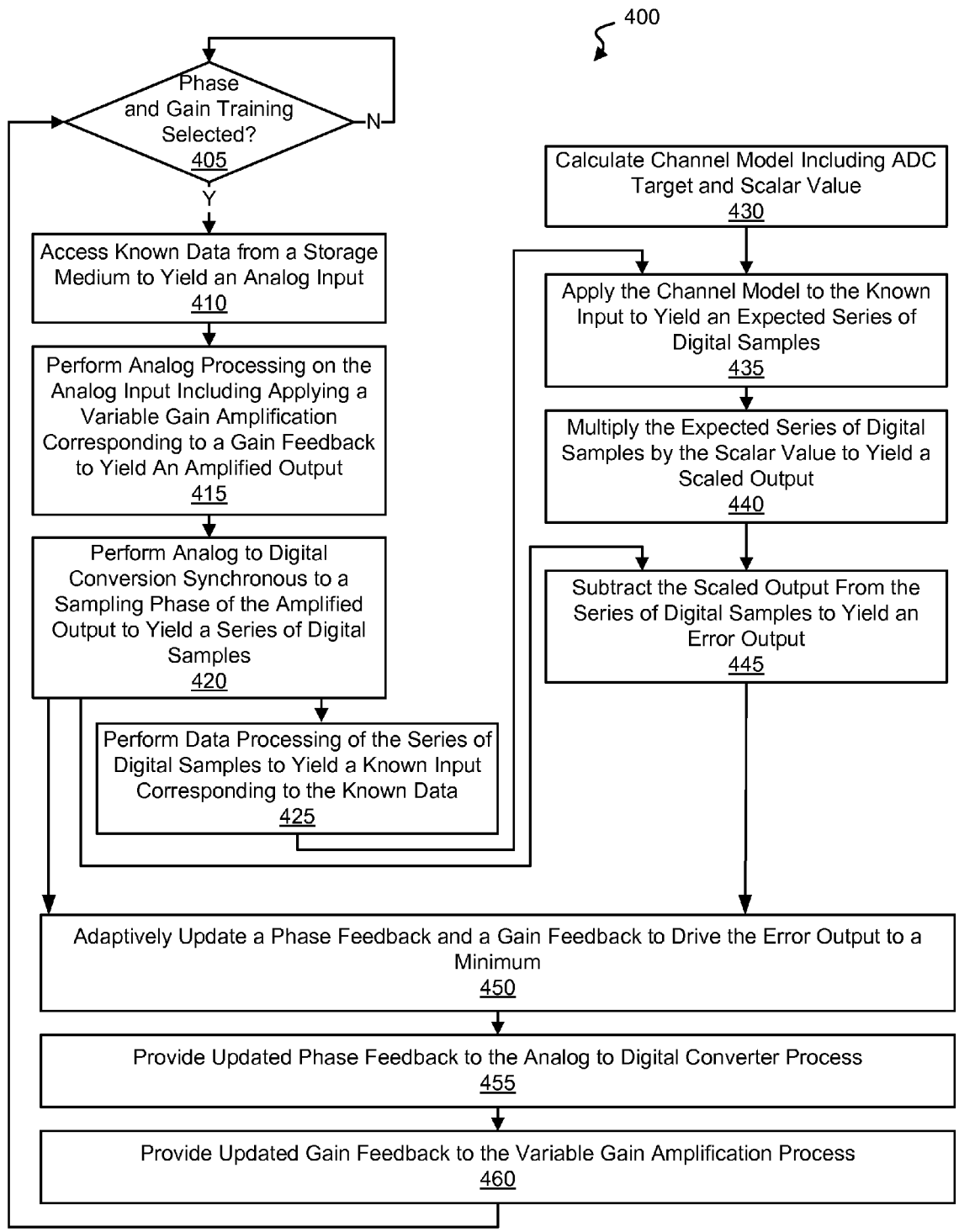
FIG. 4 is a flow diagram showing a method for ADC based timing and gain loop processing in accordance with various embodiments of the present invention.

FIG. 4 is a flow diagram showing a method for ADC based timing and gain loop processing in accordance with various embodiments of the present invention. Following flow diagram 400, it is determined whether training of a gain and sampling phase of a data processing circuit is desired (block 405). In some cases, such phase and gain training is performed at circuit start up and may be repeated at various times during circuit operation. As an example, the phase and gain training may be done based upon a timeout condition, or may be performed when an error rate of a data processing circuit increases. Based upon the disclosure provided herein, one of ordinary skill in the art will recognize a variety of instances where phase and gain training may be selected.

Where phase and gain training is selected (block 405), known data is accessed from a storage medium to yield an analog output (block 410). This process may include, for example, moving a read/write head assembly relative to a storage medium such that the read/write head assembly is disposed over an area where a known data is stored. The known data may be exclusively used for training, or may be user data that was previously written to the storage medium. The analog output corresponding to the known data derived from the storage medium is processed including application of a variable gain to yield an amplified signal (block 415). The variable gain amplification applies a gain with a magnitude corresponding to a gain feedback.

An analog to digital conversion is applied to the amplified signal to yield a series of digital samples represented as x[n] (block 420). The analog to digital conversion is done synchronous to a sampling phase which is adjusted based at least in part on a phase feedback. A data processing algorithm is applied to the series of digital samples to yield a known input corresponding to the known data derived from the storage medium (block 425). The known input is represented as a[n]. The data processing algorithm may be any data processing approach designed to recover data originally written to a storage medium. As an example, the data processing algorithm may include one or more iterations applying a data detection algorithm and a data decoding algorithm to a received data input to recover an original data set. In some cases, the data detection algorithm is a Viterbi algorithm data detection process and the data decoding algorithm is a low density parity check algorithm. Based upon the disclosure provided herein, one of ordinary skill in the art will recognize a variety of data processing algorithms and corresponding circuitry that may be used in relation to different embodiments of the present invention.

A channel model is calculated including an analog to digital converter target and a scalar value (block 430). Calculating the channel model involves modeling the output of an analog front end circuit and analog to digital converter circuit using information corresponding to a nominal channel bit density of a device or channel from which the aforementioned series of digital samples is derived. This includes computing a bit response ($h_b[n]$) of the channel for an assumed shape (e.g., erf( ) or tan h( )) for the step response of the channel ($h_s[n]$). This calculated channel model may be used to pre-calculate values that are stored to a look-up table and addressed by a quantized channel bit density provides an efficient implementation.

The aforementioned constructed channel model is used along with given values of sampling phase and dynamic range of the analog to digital converter circuit yielding the series of digital samples to determine a scalar value ($\alpha$) and an analog to digital converter target response. In particular, the overall channel bit response for $\tau=[0,1]$ (i.e., $\tau$ extends from no phase offset to a full bit period offset) representing the sampling phase of analog to digital converter circuit 320 normalized to a bit period, and $[-\beta, +\beta]$ representing the dynamic range of analog to digital converter circuit:

$$h_b[k,\tau] = h_s[k,\tau] - h_s[k-1,\tau],$$

$$h_s[k,\tau] = \text{erf}\left(2\sqrt{\ln 2}\, \frac{k+\tau}{\text{channel bit density}}\right),$$

$$\tilde{h}_b[k,\tau] = \sum_l h_b[k-l,\tau]f[l],$$

where $h_b[k,\tau]$ is the channel bit response, $h_s[k,\tau]$ is the raw channel model, $\tilde{h}_b[k,\tau]$ the analog front end filtered raw channel bit response, and f[k] is the impulse response of analog front end circuit 308. Based upon the aforementioned equations, the analog to digital converter target is calculated in accordance with the following equation:

$$g[k,\tau]=\hat{h}_b[k,\tau].$$

The scalar value is calculated in accordance with the following equation:

$$\alpha = \frac{\beta}{\sum_{k=-M}^{M} g[k,\tau]}.$$

The channel model is applied to the known input to yield an expected series of digital samples (block 435). The expected output is represented as s[n,τ] and is described by the following equation:

$$s[n,\tau] = \sum_{k=-M}^{M} a[k]g[k,\tau],$$

where the known input (a[k]) is convolved with the analog to digital converter target g[k,τ] over a defined range −M to M. The expected series of digital samples is then multiplied by the scalar value to yield a scaled output (block 440). The scaled output is represented as $\hat{x}[n,\tau]$ and is calculated in accordance with the following equation:

$$\hat{x}[n,\tau] = \frac{\beta}{\sum_{k=-M}^{M} g[k,\tau]} \left( \sum_{k=-M}^{M} a[k]g[k,\tau] \right).$$

The scaled output is subtracted from the series of digital samples to yield an error output (block 445). The error output is represented as e[n], and is calculated in accordance with the following equation:

$$e[n]=x[n]-\hat{x}[n,\tau].$$

The series of digital samples and the error output are used to adaptively update a phase feedback and a gain feedback to drive the error output to a minimum (block 450). In particular, the phase feedback and gain feedback are calculated in accordance with the following equations:

phase feedback=phase feedback−
    $\mu_1 \cdot e[n] \cdot sgn(\hat{x}[n,\tau]-\hat{x}[n-1,\tau])$;

and gain feedback=gain feedback−$\mu_1 \cdot e[n] \cdot sgn(\hat{x}[n,\tau])$.

In this case, $\mu_1$ is a programmable scaling factor that controls the amount of change to gain feedback and phase feedback that is allowed for any bit period. Alternatively, the adaptive approach may be operated in accordance with the following equations:

phase feedback=phase feedback−
    $\mu_1(x[n-1]\cdot\hat{x}[n,\tau]-x[n]\cdot\hat{x}[n-1,\tau])$;

and gain feedback=gain feedback−$\mu_1 \cdot e[n] \cdot sgn(\hat{x}[n,\tau])$.

Once the adaptive loop settles, a sampling phase corresponding to the phase feedback and a gain corresponding to the gain feedback are used during real time processing of data received via an analog input. In some cases, $\mu_1$ may be modified depending upon the noise quality of the known input. For example, if known input exhibits a high signal to noise ratio (e.g., a 2T pattern), $\mu_1$ may be set to relatively high compared to a situation where the known input exhibits a low signal to noise ratio (e.g., a Nyquist pattern). The updated phase feedback is provided to the analog to digital converter process (block 455), and the updated gain feedback is provided to the variable gain amplification process (block 460).

In some cases, the effective signal to noise ratio of the signal driving the feedback loops is enhanced by applying the phase feedback and the gain feedback only when certain patterns appear in the stream of data bits. For example, loop updates may occur only when a 2T pattern (i.e., a '110011001100 . . . ' pattern). In some cases, a certain set of patterns resulting in an update may be programmed into a memory. By limiting updates to the occurrence of certain patterns, problematic patterns such as, for example, a Nyquist pattern which has a very low signal to noise ratio, are avoided.

In various cases, in place of the look-up table and polynomial fit based approaches discussed above, an adaptive approach may be employed to determine the analog to digital converter target for a specified sampling phase. In particular, the analog to digital target and scalar value may be initialized using the available channel model $\hat{h}_{b,0}[k,\tau]$ in accordance with the following equations:

initial analog to digital converter target=$g[k,\tau]=$
    $\hat{h}_{b,0}[k,\tau]$, for $k=-M$ to $M$; and $$\text{initial scalar value} = \alpha_0 = \frac{\beta}{\sum_{k=-M}^{M} g[k,\tau]}.$$

Using the aforementioned analog to digital converter target and scalar values, the channel bit response is adaptively updated for a given set of input data. Updating the channel bit response may be done in accordance with the following equations:

$$\hat{x}_l[n,\tau] = \alpha_l \sum_{k=-M}^{M} a_l[k]g_l[n-k,\tau],$$

$$\hat{h}_b[k,0]=\hat{h}_{b,l}[k,\tau],$$

and $$\hat{h}_b[k,n+1]=\hat{h}_b[k,n]+\mu \cdot e[n] \cdot a_l[n-k],$$

where $\hat{x}_l[n,\tau]$ is output of the model of the analog front end circuit, $\hat{h}_b[k,0]$ is the initial model at the $l^{th}$ sector (l≥0), $\hat{h}_b[k,n+1]$ is the updated channel model for the $l^{th}$ sector, $x_l[n]$ are data samples at the output of the analog to digital converter circuit for the $l^{th}$ sector, μ is a programmable updating gain, k is a tap index in the channel model, and n is a time index. In some cases, the channel bit response is not updated unless the received input data set can be properly processed by the downstream data processing circuits. For example, the channel bit response may not be updated if an expected sync mark within a sector of data is not found. Alternatively, an update to the channel bit response may not be implemented is a sector of data is not properly detected and decoded using a downstream data detector circuit and data decoder circuit as are known in the art.

At the end of the update period (e.g., end of a currently processing sector), interpolation may be used on the updated channel bit response to determine an updated analog to digital target and scalar value. This interpolation is used to compute the channel bit response for a particular sampling phase. The sampling phase to be used for interpolation can be determined by using the knowledge of an expected input pattern (e.g., a 2T input pattern), and an estimated channel response during times when the pattern is not available by fixing the sampling phase based on the 2T pattern.

Figure 5:
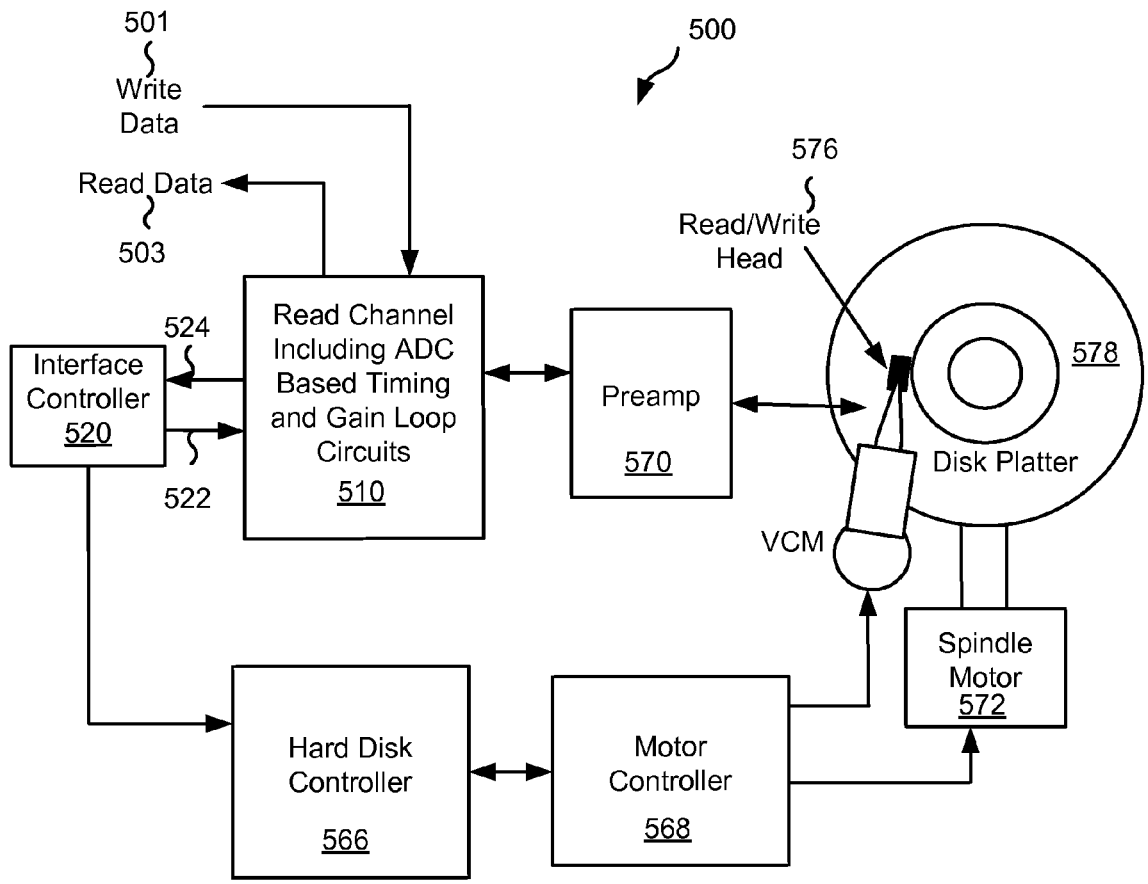
FIG. 5 shows a storage system including a read channel circuit with ADC based timing and loop gain circuits in accordance with some embodiments of the present invention.

FIG. 5 shows a storage system 500 including a read channel circuit 510 with ADC based timing and loop gain circuits in accordance with some embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head assembly 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel circuit 510 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. As part of decoding the received information, read channel circuit 510 processes the received signal using the ADC based timing and loop gain circuits that may be implemented similar to that described above in relation to FIG. 3, and/or that operate similar to that described above in relation to FIG. 4. A write operation is substantially the opposite of the preceding read operation with write data 501 being provided to read channel circuit 510. This data is then encoded and written to disk platter 578.

It should be noted that storage system 500 may be integrated into a larger storage system such as, for example, a RAID (redundant array of inexpensive disks or redundant array of independent disks) based storage system. It should also be noted that various functions or blocks of storage system 500 may be implemented in either software or firmware, while other functions or blocks are implemented in hardware.

Figure 6:
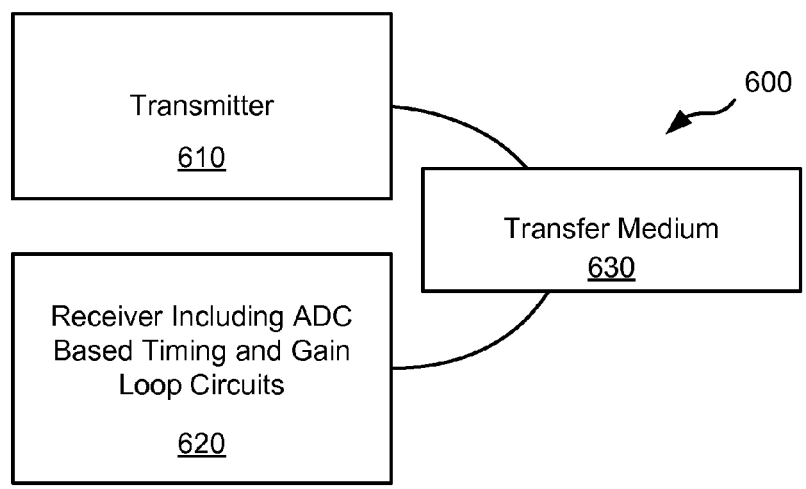
FIG. 6 depicts a wireless communication system including ADC based timing and loop gain circuits in accordance with some embodiments of the present invention.

Turning to FIG. 6, a wireless communication system 600 including a receiver with ADC based timing and loop gain circuits is shown in accordance with some embodiments of the present invention. Communication system 600 includes a transmitter 610 that is operable to transmit encoded information via a transfer medium 630 as is known in the art. The encoded data is received from transfer medium 630 by receiver 620. Receiver 620 incorporates ADC based timing and loop gain circuits that may be implemented similar to that discussed above in relation to FIG. 3, and/or operate similar to that described above in relation to FIG. 4.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the data processing circuit comprising:
    an analog to digital converter circuit operable to receive a data input and to provide corresponding digital samples synchronous to a sampling phase, wherein the sampling phase corresponds to a phase feedback;
    a target response circuit operable to provide an expected output corresponding to a known input; and
    a timing circuit, and operable to calculate a difference between the digital samples and values derived from the expected output, and to generate the phase feedback based at least in part on the difference, wherein the timing circuit is further operable to generate a gain feedback for a variable gain amplifier based at least in part on values derived from the expected output.

2. The circuit of claim 1, wherein the timing circuit is operable to adaptively calculate the phase feedback based on the difference.

3. The circuit of claim 1, wherein adaptively calculating the phase feedback is done in accordance with the following equation:

$$\text{phase feedback} = \text{phase feedback} - \mu_1(x[n-1] \cdot \hat{x}[n,\tau] - x[n] \cdot \hat{x}[n-1,\tau]),$$

wherein x[n−1] corresponds to a preceding instance of the digital samples, x[n] corresponds to a current instance of the digital samples, $\hat{x}[n,\tau]$ corresponds to a current instance of the values derived from the expected output, $\hat{x}[n-1,\tau]$ corresponds to a preceding instance of the values derived from the expected output, and $\mu_1$ corresponds to an update rate value.

4. The circuit of claim 3, wherein the update rate value is selected from a group of values consisting of: one, zero, and a value between zero and one.

5. The circuit of claim 1, wherein the circuit further comprises:
a summation circuit operable to subtract the values derived from the expected output from the digital samples to yield the difference, and wherein the difference is an error output and
wherein adaptively calculating the phase feedback is done in accordance with the following equation:

phase feedback=phase feedback–
  $\mu_1$·(error output)·sgn($\hat{x}[n,\tau]-\hat{x}[n-1,\tau]$), wherein $\hat{x}[n,\tau]$ corresponds to a current instance of the values derived from the expected output, $\hat{x}[n-1,\tau]$ corresponds to a preceding instance of the values derived from the expected output, sgn( ) indicates a sign, and $\mu_1$ corresponds to an update rate value.

6. The circuit of claim 5, wherein the update rate value is selected from a group of values consisting of: one, zero, and a value between zero and one.

7. The circuit of claim 1, wherein the circuit further comprises:
the variable gain amplifier operable to amplify an analog input by a gain corresponding to the gain feedback to yield an amplified output, wherein the data input is derived from the amplified output.

8. The circuit of claim 7, wherein the circuit further comprises:
a summation circuit operable to subtract the values derived from the expected output from the digital samples to yield the difference, and wherein the difference is an error output, and
wherein the timing circuit is operable to adaptively calculate the gain feedback based on the error output and the values derived from the expected output.

9. The circuit of claim 8, wherein adaptively calculating the gain feedback is done in accordance with the following equation:

gain feedback=gain feedback–
  $\mu_1$·(error output)·sgn($\hat{x}[n,\tau]$), wherein sgn($\hat{x}[n,\tau]$) corresponds to a sign of a current instance of the values derived from the expected output, and $\mu_1$ corresponds to an update rate value.

10. The circuit of claim 1, wherein the target response circuit is implemented as a look-up table having pre-computed values selectable using the known input.

11. The circuit of claim 10, wherein the target response circuit further comprises:
an interpolator circuit operable to interpolate from one or more pre-computed values to generate a value corresponding to the known input.

12. The circuit of claim 1, wherein the target response circuit is implemented as an adaptable filter circuit receiving the known input.

13. The circuit of claim 1, wherein the circuit is implemented as part of a device selected from a group consisting of: a storage device and a receiving device.

14. The circuit of claim 1, wherein the circuit is implemented as part of an integrated circuit.

15. The circuit of claim 1, wherein the known input is derived by applying a data processing algorithm to the digital samples.

16. A data processing circuit, the data processing circuit comprising:
a variable gain amplifier operable to amplify an analog input by a gain corresponding to a gain feedback to yield an amplified output;
an analog to digital converter circuit operable to receive a signal derived from the amplified output and to provide corresponding digital samples;
a target response circuit operable to provide an expected output corresponding to a known input, wherein the target response circuit is implemented as a look-up table having pre-computed values selectable using the known input;
a summation circuit operable to subtract values derived from the expected output from the digital samples to yield an error output; and
a gain circuit operable to generate the gain feedback based at least in part on the error output and the values derived from the expected output.

17. The circuit of claim 16, wherein generating the gain feedback includes adaptively calculating the gain feedback based at least in part on the error output and the values derived from the expected output.

18. The circuit of claim 17, wherein adaptively calculating the gain feedback is done in accordance with the following equation:

gain feedback=gain feedback–
  $\mu_1$·(error output)·sgn($\hat{x}[n,\tau]$), wherein sgn($\hat{x}[n,\tau]$) corresponds to a sign of a current instance of the values derived from the expected output, and $\mu_1$ corresponds to an update rate value.

19. The circuit of claim 18, wherein the update rate value is selected from a group of values consisting of: one, zero, and a value between zero and one.

20. The circuit of claim 16, wherein the target response circuit is implemented as a look-up table having pre-computed values selectable using the known input.

21. The circuit of claim 20, wherein the target response circuit further comprises:
an interpolator circuit operable to interpolate from one or more pre-computed values to generate a value corresponding to the known input.

22. The circuit of claim 16, wherein the target response circuit is implemented as an adaptable filter circuit receiving the known input.

23. The circuit of claim 16, wherein the circuit is implemented as part of a device selected from a group consisting of: a storage device and a receiving device.

24. The circuit of claim 16, wherein the circuit is implemented as part of an integrated circuit.

25. The circuit of claim 16, wherein the known input is derived by applying a data processing algorithm to the digital samples.

26. A method for updating a control loop, the method comprising:
receiving an analog input signal including information corresponding to a known input;
amplifying a signal derived from the input signal by a gain to yield an amplified output, wherein the gain corresponds to a gain feedback;

converting a signal derived from the amplified output to yield a series of digital samples synchronous to a sampling phase, wherein the sampling phase corresponds to a phase feedback;

applying a channel response model to the known input to yield an expected output, wherein the channel response model is implemented as a look-up table having pre-computed values selectable using the known input;

subtracting an output derived from the expected output from the digital samples to yield an error output; and calculating the gain feedback based at least in part on the error output and the output derived from the expected output.

27. The method of claim 26, wherein the method further comprises:

calculating the phase feedback based at least in part on the error output and the output derived from the expected output.

28. The method of claim 26, wherein the method further comprises:

calculating the phase feedback based at least in part on the digital samples and the output derived from the expected output.

\* \* \* \* \*